United States Patent [19]

Ghaffaripour et al.

[11] Patent Number: 5,648,742
[45] Date of Patent: Jul. 15, 1997

[54] AMPLIFIER CIRCUIT WITH REDUCED TURN-ON AND TURN-OFF TRANSIENTS

[75] Inventors: Parviz Ghaffaripour, Saratoga; Sai L. Ting, San Jose, both of Calif.

[73] Assignee: National Semiconductor Corporation, Santa Clara, Calif.

[21] Appl. No.: 546,910

[22] Filed: Oct. 23, 1995

[51] Int. Cl.$^6$ ....................................................... H03F 1/14
[52] U.S. Cl. ................................................. 330/51; 330/69
[58] Field of Search ............................. 330/51, 69, 149; 381/94, 120

[56] References Cited

U.S. PATENT DOCUMENTS

| | | | |
|---|---|---|---|
| 4,983,927 | 1/1991 | Torazzina | 330/51 |
| 5,363,062 | 11/1994 | Nebuloni et al. | 330/51 X |

*Primary Examiner*—Steven Muttola
*Attorney, Agent, or Firm*—Limbach & Limbach L.L.P.

[57] ABSTRACT

An amplifier circuit with improved turn-on and turn-off transient operation includes an amplifier and a controller for controlling the mode of operation of the amplifier during initial and subsequent circuit turn-on and turn-off. The amplifier is biased by a positive power supply voltage and has a differential input which is driven by a reference voltage and a single-ended input signal. Where the output is single-ended, a single amplifier provides a single-ended output signal. Where the output is differential, the amplifier includes cascaded, differential input, single-ended output amplifiers which together provide a differential output signal. One of each of the differential inputs is driven by the reference voltage which, following circuit turn-on, charges to a value of half of the positive power supply voltage. Following circuit turn on and turn-off and during initial charging or discharging, respectively, of the reference voltage, the controller places the amplifier in an operation mode whereby the single-ended output signal follows the relatively slowly charging or discharging reference voltage and the differential output signal remains at zero. When the reference voltage is fully charged, the controller places the amplifier in another operation mode whereby both the single-ended and differential output signals become equal to the sum of the reference voltage and a multiple of the input signal. Hence, turn-on and turn-off transients in the output signal due to circuit turn-on and turn-off are avoided.

37 Claims, 3 Drawing Sheets

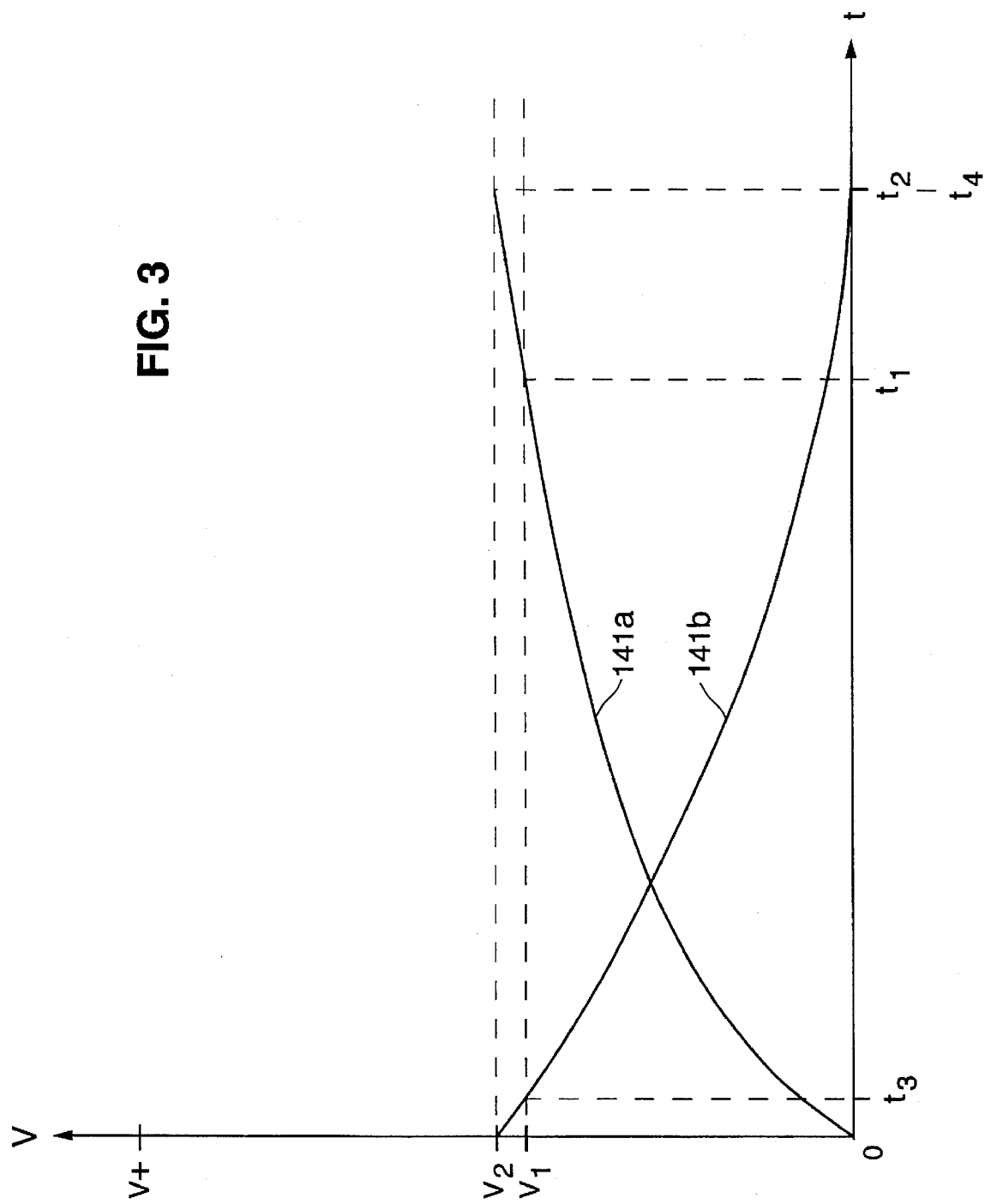

AMPLIFIER CIRCUIT WITH REDUCED TURN-ON AND TURN-OFF TRANSIENTS

BACKGROUND OF THE INVENTION

1. Field of the Invention

The present invention relates to analog amplifier circuits, and in particular, to analog amplifier circuits for receiving AC-coupled input signals and producing DC-coupled output signals.

2. Description of the Related Art

Referring to FIG. 1, analog amplifiers, such as audio power amplifiers, are often required to operate from a single power supply. This means the AC input signal (VIN) must be AC-coupled to the input of the amplifier circuit since the internal AC reference, or "ground," for the amplifier circuit is at DC voltage between DC circuit ground and the power supply potential, e.g. at a value equal to one-half of the applied DC power supply voltage. This AC reference is established by a resistive voltage divider ($R_1$ and $R_2$) with a bypass capacitor ($C_B$) for charging to and maintaining the DC reference voltage across the lower resister. (In this particular circuit, as is often the case for audio power amplifiers, two serially cascaded inverting amplifiers are used in a bridge-tied-load configuration to drive a load, e.g. a speaker, with a differential output signal.)

However, this type of circuit suffers from a problem due to the necessity of having an AC-coupled input. Upon application of DC power (V+) to this circuit, the bypass capacitor begins to charge, as does the input coupling capacitor ($C_C$) which is grounded at the input side by the output impedance of the grounded input signal source. Since the RC time constant for the bypass capacitor and its associated charging resistance are typically different from that for the input coupling capacitor and its associated charging resistance the capacitors charge at different rates. This results in the two capacitors having, at any given points in time during their charging or discharging periods, different voltages across them. In turn, this causes a transient signal to appear across the load. For example, during initial circuit turn-on, the current for charging the input coupling capacitor flows form the output of the first amplifier through its feedback ($R_{F1}$) and input ($R_{I1}$) resistors. The resulting signal at the output of the first amplifier appears at the load in the "negative" portion (VOUT−) of the differential output signal, with the "positive" portion (VOUT+) applied by the second, cascaded inverting amplifier. This initial signal across the load is a turn-on transient which in the case of an audio power amplifier produces a "click" or "pop" from the speaker. (Similarly, during circuit turn-off, a turn-off transient produced by unequal discharging of the capacitors will often produce a "click" or "pop" from the speaker as well.)

Similar turn-on and turn-off transients occur in single-ended circuits, i.e. those amplifier circuits in which a single-ended output signal is provided to a grounded load (e.g. either VOUT− or VOUT+ only) rather than a differential output signal to a load isolated from circuit ground.

Conventional amplifier circuits have been developed which address this "pop" problem in a number of different ways. One approach has been to avoid using single power supply circuits by biasing the amplifier circuit between equal positive and negative power supply voltages with the output driving a grounded load. This allows the input coupling capacitor to be eliminated, thereby eliminating the cause of the turn on and turn-off transients. However, this requires a second power supply which increases system complexity and costs. Another approach has been to apply the single DC power supply voltage in a gradual manner to initiate the flow of DC bias currents within the amplifiers. However, this results in the amplifier circuit having an indeterminate state of operation during turn-on. Further, turn-on and turn-off transients can still occur when power is removed and quickly reinstated as in when a system reset is performed.

Accordingly, it would be desirable to have an analog amplifier which can be operated with a single power supply and reduced turn-on and turn-off transients.

SUMMARY OF THE INVENTION

An amplifier circuit for operating with a single power supply and reduced turn-on and turn-off transients in accordance with the present invention prevents transients due to circuit turn-on and turn-off from occurring in its output signal. Where the output signal is single-ended, the output signal is forced to follow a relatively slowly charging reference signal during initial circuit turn-on and circuit turn-off. Where the output signal is differential, the differential output signal amplitude is maintained at zero during initial circuit turn-on and circuit turn-off.

An amplifier circuit for operating with a single power supply and controllable modes of operation to reduce turn-on and turn-off transients in accordance with one embodiment of the present invention includes an amplifier and a controller. The amplifier is for biasing between a power supply voltage and a circuit ground and operating in a number of modes of operation and in accordance therewith providing an output signal. One of the modes of operation includes receiving a first reference voltage having a value between the power supply voltage and circuit ground and in accordance therewith the output signal is substantially equal to the first reference voltage. A second one of the modes of operation includes receiving the first reference voltage and an input signal and in accordance therewith the output signal is substantially equal to a sum of the first reference voltage and a multiple of the input signal. The controller is coupled to the amplifier and is for receiving the first reference voltage and a second reference voltage and in accordance therewith establishing the modes of operation of the amplifier. During a first time period in which the amplifier is biased between the power supply voltage and circuit ground the amplifier operates in one of the modes of operation and during a second time period, subsequent to the first time period, the amplifier operates in another one of the modes operation.

An amplifier circuit for operating with a single power supply and reduced turn-on and turn-off transients in accordance with another embodiment of the present invention includes a reference generator, a controller and an amplifier. The reference generator is for biasing between a power supply voltage and a circuit ground and in accordance therewith providing first and second reference voltages having values between the power supply voltage and circuit ground. The first reference voltage is initially at an initial reference value and subsequently moves toward a final reference value. The controller is coupled to the reference generator and is for receiving the first and second reference voltages and in accordance therewith providing a control signal. The amplifier is coupled to the reference generator and the controller and is for biasing between the power supply voltage and circuit ground and for receiving the control signal and in accordance therewith operating in one of a number of modes of operation for providing a first output signal. One of the modes of operation includes receiving the first reference voltage and in accordance therewith the first output signal is substantially equal to the first reference voltage as the first reference voltage initially moves from its initial reference value toward its final reference value. A second one of the modes of operation includes receiving the first reference voltage and an input signal and in accordance therewith the first output signal is substantially equal to a sum of the first reference voltage and a multiple of the input signal as the first reference voltage moves past the second reference voltage.

These and other features and advantages of the present invention will be understood upon consideration of the following detailed description of the invention and the accompanying drawings.

BRIEF DESCRIPTION OF THE DRAWINGS

FIG. 3 is a voltage-versus-time diagram for the charging of the primary reference voltage for the circuits of FIG. 2.

DETAILED DESCRIPTION OF THE INVENTION

Figure 1:
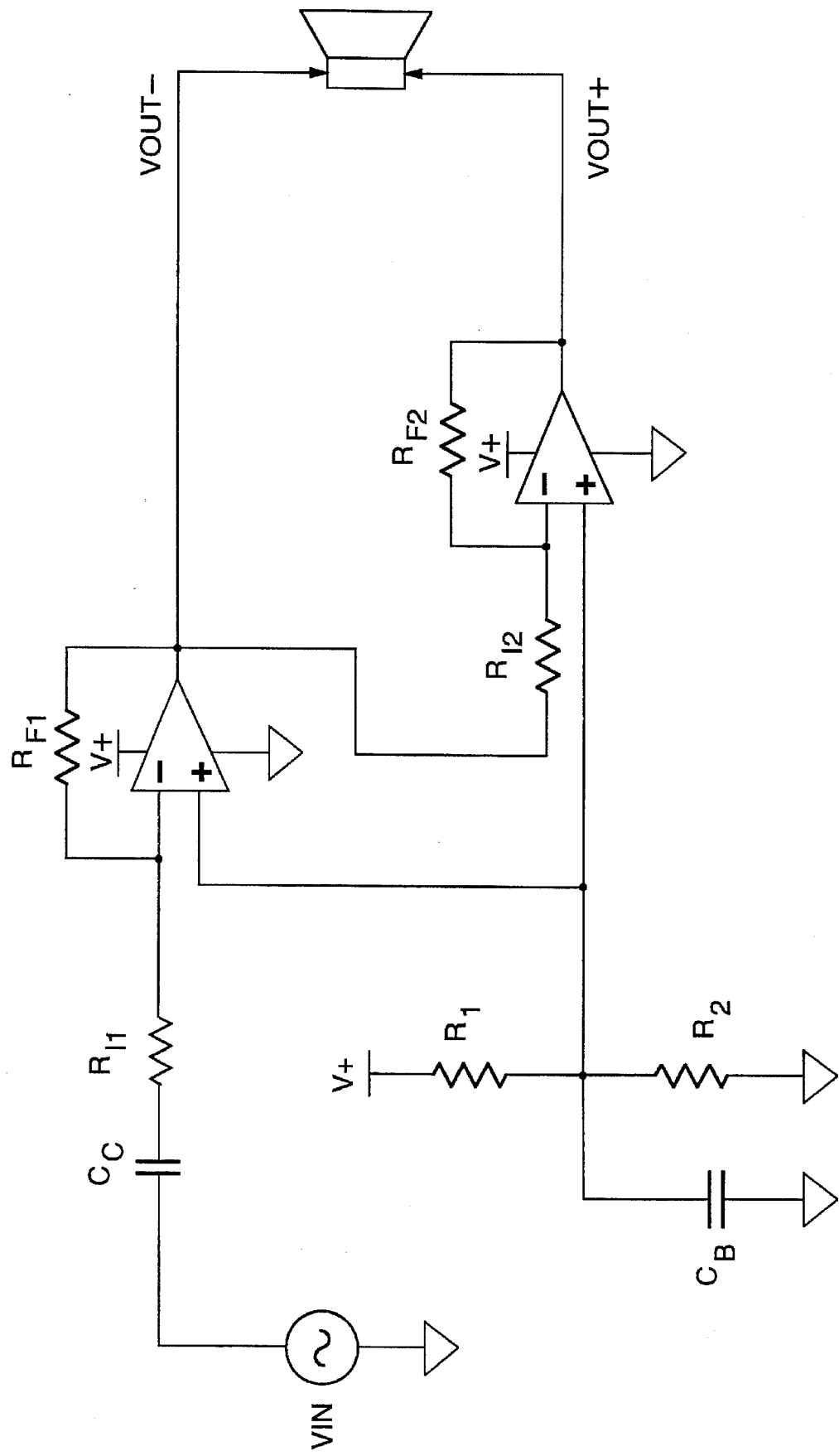
FIG. 1 is a schematic diagram of a conventional analog amplifier circuit for amplifying audio signals in a bridge-tied-load configuration.
Figure 2:
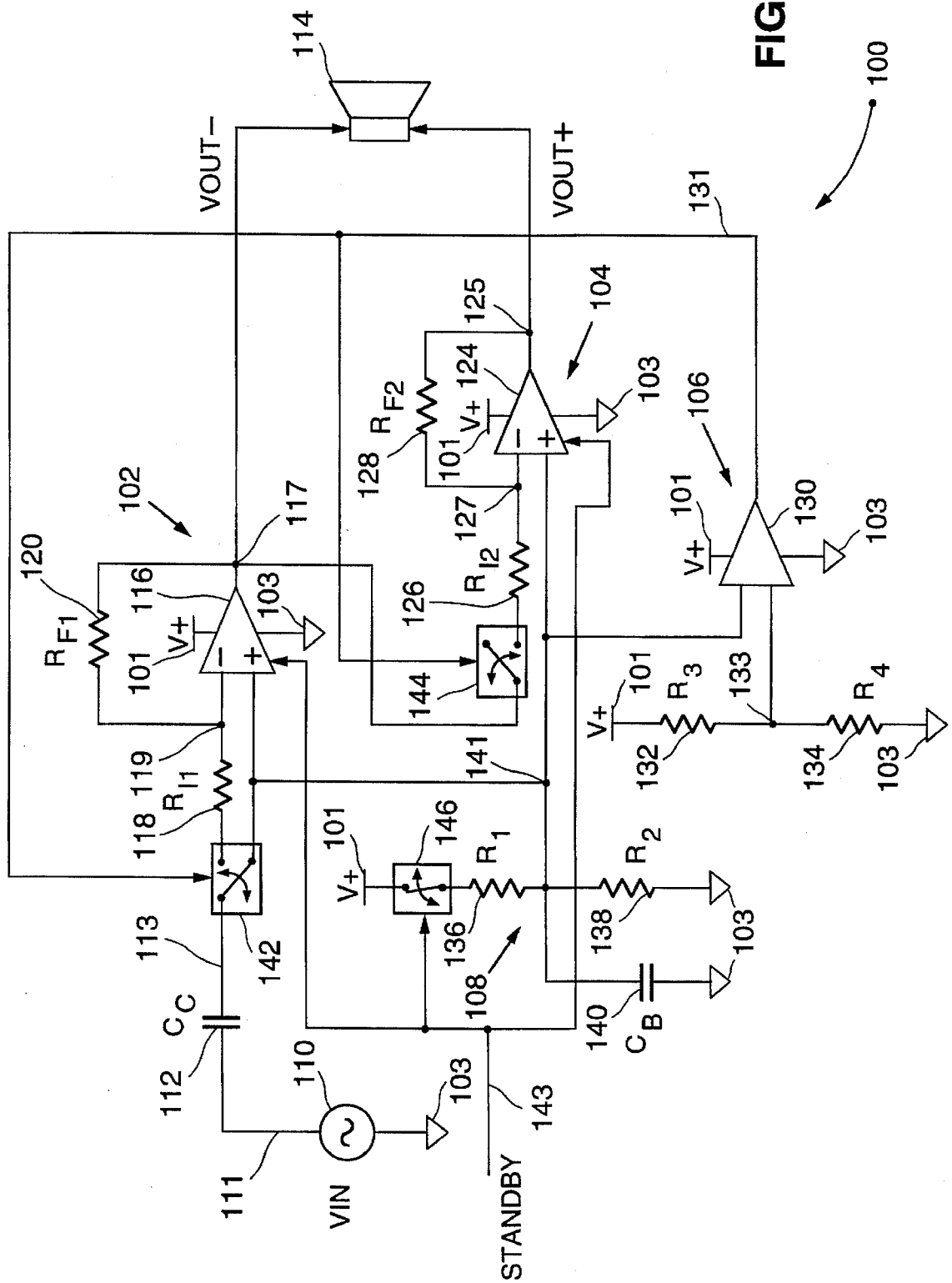
FIG. 2 is a schematic diagram of an analog amplifier circuit in accordance with one embodiment of the present invention.

Referring to FIG. 2, an amplifier circuit 100 in accordance with one embodiment of the present invention includes a first amplifier 102, a second amplifier 104, a controller 106 and a reference generator 108. As discussed in more detail below, the amplifiers 102, 104 have controllable modes of operation which are controlled by the controller 106. Based upon the values of two reference voltages provided by the reference generator 108, the controller 106 determines the mode of operation of each of the amplifiers 102, 104. The amplifier circuit 100 is driven by an AC signal source 110 through a coupling capacitor 112 and drives a load 114, e.g. a speaker. The first amplifier 102 provides an output signal VOUT− which drives the input to the second amplifier 104 and the load 114. The second amplifier 104 is an inverting amplifier with a gain of unity and provides an output signal VOUT+ which is substantially equal in magnitude and inverse in phase to the first output signal VOUT−. These two output signals VOUT−, VOUT+ form the "positive" and "negative" phases of a differential output signal provided to the load 114. It should be understood, however, that in accordance with the following discussion and the present invention, the load 114 can, alternatively, be a grounded load (e.g. an ac-grounded load, or a dc-grounded load which is capacitively coupled to the amplifier output) which is driven by only the output signal VOUT− from the first amplifier 102. (Although the following discussion is in terms of an inverting amplifier, it should be understood that the principles of the present invention are equally applicable to a noninverting amplifier as well.)

The first amplifier 102 includes an operational amplifier (Op-Amp) 116, an input resistor 118, a feedback resistor 120 and an input switch 142 (discussed in more detail below), connected substantially as shown. Similarly, the second amplifier 104 includes an Op-Amp 124, an input resistor 126, a feedback resistor 128 and an input switch 144 (discussed in more detail below), connected substantially as shown. In accordance with well known Op-Amp principles, the two amplifiers 102, 104 are inverting amplifiers with their respective voltage gains determined by the ratios of their feedback resistors to their input resistors. As noted above, the second amplifier 104 has a gain of unity. Therefore, its input 126 and feedback 128 resistors have equal values ($R_{I2}=R_{F2}$). The input 118 and feedback 120 resistors for the first amplifier 102 can be selected to provide the desired signal gain for the amplifier circuit. The controller 106 includes a voltage comparator 130. The reference generator 108 includes a first resistive voltage divider consisting of serially connected resistors 136, 138, a standby switch 146 and a bypass capacitor 140, plus a second resistive voltage divider consisting of two serially connected resistors 132, 134, all connected substantially as shown.

During initial turn-on of the amplifier circuit 100, the standby switch 146 is closed (per a standby control signal 143) and the power supply 101 voltage V+ is applied to the Op-Amps 116, 124, comparator 130 and reference resistors 136, 138, 132, 134. (The standby control signal 143 can also be used, as shown, to control the turn-on and turn-off of the Op-Amps 116, 124, e.g. in accordance with the technique disclosed in copending, commonly assigned U.S. patent application Ser. No. 08/168,448, entitled "Click/Pop Free Bias Circuit" and filed on Dec. 17, 1993, the disclosure of which is hereby incorporated by reference.) Accordingly, the primary reference voltage 141 across the bypass capacitor 140 is initially zero due to the initially discharged state of the bypass capacitor 140 and begins to charge toward its charged value based upon the ratio of the lower resistor 138 to the sum of the resistors 136, 138. Meanwhile, however, the secondary reference voltage 133 is at its full value immediately, as determined by the ratio of the lower resistor 134 to the sum of the resistors 132, 134. (According to one embodiment of the present invention, and as discussed in more detail below, the secondary reference voltage 133 is selected to be slightly less than the fully charged value of the primary reference voltage 141.) The comparator 130 compares these two reference voltages 141, 133 and provides an output control signal 131 to the switches 142, 144 based upon such comparison.

Initially, as long as the primary reference voltage 141 is less than the secondary reference voltage 133, the control signal 131 causes the switches 142, 144 to operate in their respective first states as shown in FIG. 2. With the first input switch 142 in its first state, one terminal of the input coupling capacitor 112 is connected to the non-inverting input of the first Op-Amp 116, thereby resulting in the coupling 112 and bypass 140 capacitors being effectively connected in parallel (with the other terminal of the input coupling capacitor 112 connected to circuit ground 103 through the output impedance of the input signal source 110). This causes the coupling 112 and bypass 140 capacitors to be charged together by the primary reference voltage 141 through resistor 136 and the first amplifier 102 to function as a voltage follower with respect to its non-inverting input which receives the primary reference voltage 141. Therefore, the output voltage 117 of the first Op-Amp 116 is equal to its input voltage, i.e. the primary reference voltage 141.

With the second input switch 144 in its first state, such switch 144 is in its open, or high impedance, state, thereby interrupting the connection between the output of the first Op-Amp 116 and the input resistor 126 the second amplifier 104 to as causes the second amplifier 104 to also function as a voltage follower with respect to its non-inverting input which also receives the primary reference voltage 141. Therefore, the output voltage 125 of the second Op-Amp 124 is equal to its input voltage, i.e. the primary reference voltage 141. Accordingly, the two output signals VOUT−, VOUT+ to the load 114 are equal, thereby resulting in a net zero differential signal to the load 114.

Eventually, the primary reference voltage 141 charges up to and surpasses the secondary reference voltage 133. The comparator 130 senses this and adjusts its output control signal 131 accordingly. When the primary reference voltage 141 exceeds the secondary reference voltage 133 the comparator control signal 131 causes the switches 142, 144 to operate in their respective second states. With the first input switch 142 in its second state, the terminal of the input coupling capacitor 112 previously connected to the non-inverting input of the first Op-Amp 116 is now connected to the input resistor 118 of the first Op-Amp 116. With the second input switch 144 in its second state, such switch 144 is in its closed, e.g. shorted, state, thereby providing the output signal 117 of the first amplifier 102 as the input signal to the second amplifier 104. The amplifier circuit 100 is then configured for its normal, steady-state AC signal operation. The two amplifiers 102, 104 operate as two serially cascaded, inverting amplifiers which receive the single-ended AC-coupled input signal 113 and amplify it to provide to the load 114 a differential signal formed by two output signals VOUT−, VOUT+ which are equal in magnitude and inverse in phase.

During turn-off of the amplifier circuit 100 (with the standby switch 146 still closed per the standby control signal 143), biasing from the power supply 101 voltage V+ to the Op-Amps 116, 124, comparator 130 and reference resistors 136, 138, 132, 134 is removed. The output control signal 131 from the comparator 130 is no longer asserted; therefore, the switches 142, 144 revert to their first states. This results in one terminal of the input coupling capacitor 112 being reconnected to the non-inverting input of the first Op-Amp 116, thereby effectively connecting the coupling 112 and bypass 140 capacitors in parallel again (with the other terminal of the input coupling capacitor 112 connected to circuit ground 103 through the output impedance of the input signal source 110). This results in the primary reference voltage 141 across the coupling 112 and bypass 140 capacitors being discharged through resistor 138. Meanwhile, both amplifiers 102, 104 function as voltage followers with respect to their non-inverting inputs which are receiving the primary reference voltage 141. Accordingly, the two output signals VOUT−, VOUT+ to the load 114 are equal, i.e. to the primary reference voltage 141, thereby resulting in a net zero differential signal to the load 114.

Alternatively, during standby operation, the standby switch 146 is opened (per the standby control signal 143), but the biasing from the power supply 101 voltage V+ to the Op-Amps 116, 124, comparator 130 and reference resistors 136, 138, 132, 134 is maintained. Accordingly, the primary reference voltage 141 across the bypass capacitor 140, initially at its charged value based upon its reference resistors 136, 138, begins to discharge toward zero. Initially, as long as the primary reference voltage 141 is still more than the secondary reference voltage 133, the control signal 131 from the comparator causes the switches 142, 144 to remain in their respective second states. Hence, per the foregoing discussion, a differential signal formed by the two output signals VOUT−, VOUT+ which are equal in magnitude and inverse in phase is provided to the load 114. Eventually, the primary reference voltage 141 discharges down to and falls below the secondary reference voltage 133. The comparator 130 senses this and adjusts its output control signal 131 accordingly thereby causing the switches 142, 144 to revert to their respective first states. Hence, per the foregoing discussion, the two output signals VOUT−, VOUT+ to the load 114 are equal, i.e. to the primary reference voltage 141, thereby resulting in a net zero differential signal to the load 114.

As should be understood from the foregoing discussion, with a net zero differential signal applied across the load 114, no turn-on or turn-off transients are presented to the load 114. Similarly, it should be understood that where the load 114 is a grounded load and a single-ended output signal (i.e. either VOUT− or VOUT+) is applied thereto, no turn-on or turn-off transients occur. During turn-on, the output signal equals the primary reference voltage 141 which is initially zero and then subsequently a slowly charging DC voltage. During turn-off, the DC component of the output signal is initially maintained and then subsequently decreased slowly in accordance with the slowly discharging primary reference voltage 141.

In should be understood that each of the above-discussed switches 142, 144, 146 can be realized in a number of different ways. For example, simple electromechanical relays can be used. Alternatively, solid state switches in the form of transistors can be used. For example, metal oxide semiconductor field effect transistors (MOSFETs) can be used in the form of pass gates or transmission gates (both of which are well known in the art) with the control signal 131 accordingly being a single-ended or differential signal, respectively. Further, the switch control signal 131 can simply be binary, e.g. with high and low voltage values, or, alternatively, a "trapezoidally-shaped" signal with slower, predetermined rise and fall times so as to cause the switches 142, 144, 146 to turn on and off in a slower, more controlled manner. This latter type of signal can be particularly advantageous when the switches 142, 144, 146 are solid state and it is desirable for the switches 142, 144, 146 to have a finite serial impedance associated therewith when transitioning between their full-on and full-off states.

Referring to FIG. 3, the above-discussed difference between the primary 141 and secondary 133 reference voltages can be better understood. As discussed above, during turn-on, the primary reference voltage $141a$ charges from an initial value of zero to a final value of $V_2$ which is determined by the ratio of its resistors 136, 138. At a point $t_1$ in time, the primary reference voltage $141a$ equals the secondary reference voltage 133 which has a value of $V_1$ as determined by the ratio of its resistors 132, 134. Ultimately, at a subsequent point $t_2$ in time, the primary reference voltage $141a$ reaches it final value $V_2$. During the initial time interval between "time 0" (initial turn-on) and time $t_1$, the input switches 142, 144 are in their first states, and subsequently, after time $t_3$, the input switches 142, 144 are switched to their second states, as discussed above.

Conversely, during turn-off, the primary reference voltage $141b$ discharges from its initial value of $V_2$ to a final value of zero. At a point $t_3$ in time, the primary reference voltage $141b$ equals the secondary reference voltage 133 value of $V_1$. Ultimately, at a subsequent point $t_4$ in time, the primary reference voltage $141b$ reaches it final value of zero. During the initial time interval between "time 0" (initial turn-off) and time $t_3$, the input switches 142, 144 are in their second states, and subsequently, after time $t_3$, the input switches 142, 144 are switched to their first states, as discussed above.

The above-discussed embodiments of the present invention use two inverting amplifiers connected in series to generate the differential output signal for driving the load (amplifiers 102 and 104 in FIG. 2). However, it should be understood that other amplifier circuit configurations can be used in accordance with the principles of the present invention. For example, two amplifiers connected in parallel, one inverting and the other noninverting, can be used as well whereby the amplifiers share a common input signal and provide the two opposing phases of the differential output signal.

As should be understood from the foregoing, an amplifier circuit in accordance with the present invention has controllable modes of operation for reducing turn-on and turn-off transients. During an initial time period, following initial turn-on of the circuit, the circuit gain is controlled in such a manner as to cause the output to follow its slowly rising internal DC reference voltage. Once such DC reference voltage reaches a predetermined value, the gain of the circuit is re-established for normal, steady-state signal operation. Conversely, during an initial time period following turn-off of the circuit, the mode of operation of the circuit remains established for normal, steady-state signal operation. However, once the slowly falling internal DC reference voltage reaches a predetermined value, the mode of operation is re-established in such a manner as to cause the output to follow its slowly falling internal DC reference voltage.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including an amplifier circuit for operating with a single power supply and controllable modes of operation to reduce turn-on and turn-off transients, said amplifier circuit comprising:

a first amplifier for biasing between a power supply voltage and a circuit ground and operating in a first plurality of modes of operation and in accordance therewith providing a first output signal, wherein said first amplifier comprises a differential amplifier, and wherein a first one of said first plurality of modes of operation includes receiving a first reference voltage having a value between said power supply voltage and said circuit ground and in accordance therewith said first output signal is substantially equal to said first reference voltage, and wherein a second one of said first plurality of modes of operation includes receiving said first reference voltage and a first input signal and in accordance therewith said first output signal is substantially equal to a sum of said first reference voltage and a multiple of said first input signal; and a controller, coupled to said first amplifier, for receiving said first reference voltage and a second reference voltage and in accordance therewith establishing said first plurality of modes of operation of said first amplifier;

wherein during a first time period in which said first amplifier is biased between said power supply voltage and said circuit ground said first amplifier operates in one of said first and second ones of said first plurality of modes of operation, and during a second time period, subsequent to said first time period, said first amplifier operates in another of said first and second ones of said first plurality of modes operation.

2. An apparatus including an amplifier circuit for operating with a single power supply and controllable modes of operation to reduce turn-on and turn-off transients, said amplifier circuit comprising:

a first amplifier for biasing between a power supply voltage and a circuit ground and operating in a first plurality of modes of operation and in accordance therewith providing a first output signal, wherein a first one of said first plurality of modes of operation includes receiving a first reference voltage having a value between said power supply voltage and said circuit ground and in accordance therewith said first output signal is substantially equal to said first reference voltage, and wherein a second one of said first plurality of modes of operation includes receiving said first reference voltage and a first input signal and in accordance therewith said first output signal is substantially equal to a sum of said first reference voltage and a multiple of said first input signal; and a controller, coupled to said first amplifier, for receiving said first reference voltage and a second reference voltage and in accordance therewith establishing said first plurality of modes of operation of said first amplifier, wherein said controller includes:

a multiple-state device, coupled to said first amplifier, for receiving a control signal and in accordance therewith operating in one of a plurality of states, wherein said multiple-state device comprises a switch and said first plurality of modes of operation of said first amplifier are established in accordance with said plurality of states of said multiple-state device, and a control circuit, coupled to said multiple-state device, for receiving said first and second reference voltages and in accordance therewith providing said control signal; and wherein during a first time period in which said first amplifier is biased between said power supply voltage and said circuit ground said first amplifier operates in one of said first and second ones of said first plurality of modes of operation, and during a second time period, subsequent to said first time period, said first amplifier operates in another of said first and second ones of said first plurality of modes operation.

3. An apparatus including an amplifier circuit for operating with a single power supply and controllable modes of operation to reduce turn-on and turn-off transients, said amplifier circuit comprising:

a first amplifier for biasing between a power supply voltage and a circuit ground and operating in a first plurality of modes of operation and in accordance therewith providing a first output signal, wherein a first one of said first plurality of modes of operation includes receiving a first reference voltage having a value between said power supply voltage and said circuit ground and in accordance therewith said first output signal is substantially equal to said first reference voltage, and wherein a second one of said first plurality of modes of operation includes receiving said first reference voltage and a first input signal and in accordance therewith said first output signal is substantially equal to a sum of said first reference voltage and a multiple of said first input signal; and a controller, coupled to said first amplifier, for receiving said first reference voltage and a second reference voltage and in accordance therewith establishing said first plurality of modes of operation of said first amplifier;

wherein during a first time period in which said first amplifier is biased between said power supply voltage and said circuit ground said first amplifier operates in one of said first and second ones of said first plurality of modes of operation, and during a second time period, subsequent to said first time period, said first amplifier operates in another of said first and second ones of said first plurality of modes operation, and wherein during said first time period said first and second reference voltages comprise time-varying and fixed voltages, respectively.

4. An apparatus including an amplifier circuit for operating with a single power supply and controllable modes of operation to reduce turn-on and turn-off transients, said amplifier circuit comprising:

a first amplifier for biasing between a power supply voltage and a circuit ground and operating in a first plurality of modes of operation and in accordance therewith providing a first output signal, wherein a first one of said first plurality of modes of operation includes receiving a first reference voltage having a value between said power supply voltage and said circuit ground and in accordance therewith said first output signal is substantially equal to said first reference voltage, and wherein a second one of said first plurality of modes of operation includes receiving said first reference voltage and a first input signal and in accordance therewith said first output signal is substantially equal to a sum of said first reference voltage and a multiple of said first input signal;

a second amplifier, coupled to said first amplifier, for biasing between said power supply voltage and said circuit ground, operating in a second plurality of modes of operation and receiving a second input signal and in accordance therewith providing a second output signal, wherein a first one of said second plurality of modes of operation coincides with said first one of said first plurality of modes of operation and includes receiving said first reference voltage and in accordance therewith said second output signal is substantially equal to said first reference voltage, and wherein a second one of said second plurality of modes of operation coincides with said second one of said first plurality of modes of operation and includes receiving said first reference voltage and said second input signal and in accordance therewith said second output signal is substantially equal in magnitude and inverse in phase to said first output signal;

a controller, coupled to said first and second amplifiers, for receiving said first reference voltage and a second reference voltage and in accordance therewith establishing said first and second pluralities of modes of operation of said first amplifier and second amplifiers respectively;

wherein during a first time period in which said first amplifier is biased between said power supply voltage and said circuit ground said first amplifier operates in one of said first and second ones of said first plurality of modes of operation, and during a second time period, subsequent to said first time period, said first amplifier operates in another of said first and second ones of said first plurality of modes operation.

5. An apparatus including an amplifier circuit for operating with a single power supply and reduced turn-on and turn-off transients, said amplifier circuit comprising:

a reference generator for biasing between a power supply voltage and a circuit ground and in accordance therewith providing first and second reference voltages having values between said power supply voltage and said circuit ground, wherein said first reference voltage is initially at an initial reference value and subsequently moves toward a final reference value;

a controller, coupled to said reference generator, for receiving said first and second reference voltages and in accordance therewith providing a control signal; and a first amplifier, coupled to said reference generator and said controller, for biasing between said power supply voltage and said circuit ground and for receiving said control signal and in accordance therewith operating in one of a first plurality of modes of operation for providing a first output signal, wherein said first amplifier comprises a differential amplifier, and wherein a first one of said first plurality of modes of operation includes receiving said first reference voltage and in accordance therewith said first output signal is substantially equal to said first reference voltage as said first reference voltage initially moves from said initial reference value toward said final reference value, and further wherein a second one of said first plurality of modes of operation includes receiving said first reference voltage and a first input signal and in accordance therewith said first output signal is substantially equal to a sum of said first reference voltage and a multiple of said first input signal as said first reference voltage moves past said second reference voltage.

6. An apparatus including an amplifier circuit for operating with a single power supply and reduced turn-on and turn-off transients, said amplifier circuit comprising:

a reference generator for biasing between a power supply voltage and a circuit ground and in accordance therewith providing first and second reference voltages having values between said power supply voltage and said circuit ground, wherein said first reference voltage is initially at an initial reference value and subsequently moves toward a final reference value;

a controller, coupled to said reference generator, for receiving said first and second reference voltages and in accordance therewith providing a control signal;

a first amplifier, coupled to said reference generator and said controller, for biasing between said power supply voltage and said circuit ground and for receiving said control signal and in accordance therewith operating in one of a first plurality of modes of operation for providing a first output signal, wherein a first one of said first plurality of modes of operation includes receiving said first reference voltage and in accordance therewith said first output signal is substantially equal to said first reference voltage as said first reference voltage initially moves from said initial reference value toward said final reference value, and wherein a second one of said first plurality of modes of operation includes receiving said first reference voltage and a first input signal and in accordance therewith said first output signal is substantially equal to a sum of said first reference voltage and a multiple of said first input signal as said first reference voltage moves past said second reference voltage; and a second amplifier, coupled to said first amplifier and said controller, for biasing between said power supply voltage and said circuit ground and for receiving said control signal and in accordance therewith operating in one of a second plurality of modes of operation for providing a second output signal, wherein a first one of said second plurality of modes of operation coincides with said first one of said first plurality of modes of operation and includes receiving said first reference voltage and in accordance therewith said second output signal is substantially equal to said first reference voltage, and wherein a second one of said second plurality of modes of operation coincides with said second one of said first plurality of modes of operation and includes receiving said first reference voltage and a second input signal and in accordance therewith said second output signal is substantially equal in magnitude and inverse in phase to said first output signal.

7. A method of amplifying a signal using a single power supply and controllable modes of operation to reduce turn-on and turn-off transients, said method comprising the steps of:

biasing between a power supply voltage and a circuit ground;

receiving a first reference voltage as a time-varying voltage having a value between said power supply voltage and said circuit ground;

receiving a second reference voltage as fixed voltage;

receiving a first input signal;

establishing a first plurality of modes of operation in accordance with said first and second reference voltages; and operating in one of said first plurality of modes of operation and in accordance therewith providing a first output signal, wherein a first one of said first plurality of modes of operation includes receiving said first reference voltage and in accordance therewith said first output signal is substantially equal to said first reference voltage, and wherein a second one of said first plurality of modes of operation includes receiving said first reference voltage and said first input signal and in accordance therewith said first output signal is substantially equal to a sum of said first reference voltage and a multiple of said first input signal;

wherein during a first time period and following said step of biasing between a power supply voltage and a circuit ground said step of operating in one of said first plurality of modes of operation and in accordance therewith providing a first output signal comprises operating in one of said first and second ones of said first plurality of modes of operation, and during a second time period, subsequent to said first time period, said step of operating in one of said first plurality of modes of operation and in accordance therewith providing a first output signal comprises operating in another of said first and second ones of said first plurality of modes operation.

8. A method of amplifying a signal using a single power supply and controllable modes of operation to reduce turn-on and turn-off transients, said method comprising the steps of:

biasing between a power supply voltage and a circuit ground;

receiving a first reference voltage having a value between said power supply voltage and said circuit ground;

receiving a second reference voltage;

receiving a first input signal;

establishing a first plurality of modes of operation in accordance with said first and second reference voltages;

operating in one of said first plurality of modes of operation and in accordance therewith providing a first output signal, wherein a first one of said first plurality of modes of operation includes receiving said first reference voltage and in accordance therewith said first output signal is substantially equal to said first reference voltage, and wherein a second one of said first plurality of modes of operation includes receiving said first reference voltage and said first input signal and in accordance therewith said first output signal is substantially equal to a sum of said first reference voltage and a multiple of said first input signal;

establishing a second plurality of modes of operation in accordance with said first and second reference voltages; and operating in one of said second plurality of modes of operation and in accordance therewith providing a second output signal, wherein a first one of said second plurality of modes of operation coincides with said first one of said first plurality of modes of operation and includes receiving said first reference voltage and in accordance therewith said second output signal is substantially equal to said first reference voltage, and wherein a second one of said second plurality of modes of operation coincides with said second one of said first plurality of modes of operation and includes receiving said first reference voltage and a second input signal and in accordance therewith said second output signal is substantially equal in magnitude and inverse in phase to said first output signal;

wherein during a first time period and following said step of biasing between a power supply voltage and a circuit ground said step of operating in one of said first plurality of modes of operation and in accordance therewith providing a first output signal comprises operating in one of said first and second ones of said first plurality of modes of operation, and during a second time period, subsequent to said first time period, said step of operating in one of said first plurality of modes of operation and in accordance therewith providing a first output signal comprises operating in another of said first and second ones of said first plurality of modes operation.

9. A method of amplifying a signal using a single power supply and reducing turn-on and turn-off transients, said method comprising the steps of:

biasing between a power supply voltage and a circuit ground;

providing a first reference voltage having a value between said power supply voltage and said circuit ground, wherein said first reference voltage is initially at an initial reference value and subsequently moves toward a final reference value;

providing a second reference voltage having a value between said power supply voltage and said circuit ground;

providing a control signal in accordance with said first and second reference voltages;

operating in one of a first plurality of modes of operation in accordance with said control signal for providing a first output signal, wherein a first one of said first plurality of modes of operation includes receiving said first reference voltage and in accordance therewith said first output signal is substantially equal to said first reference voltage as said first reference voltage initially moves from said initial reference value toward said final reference value, and wherein a second one of said first plurality of modes of operation includes receiving said first reference voltage and a first input signal and in accordance therewith said first output signal is substantially equal to a sum of said first reference voltage and a multiple of said first input signal as said first reference voltage moves past said second reference voltage; and operating in one of a second plurality of modes of operation in accordance with said control signal for providing a second output signal, wherein a first one of said second plurality of modes of operation coincides with said first one of said first plurality of modes of operation and includes receiving said first reference voltage and in accordance therewith said second output signal is substantially equal to said first reference voltage, and wherein a second one of said second plurality of modes of operation coincides with said second one of said first plurality of modes of operation and includes receiving said first reference voltage and a second input signal and in accordance therewith said second output signal is substantially equal in magnitude and inverse in phase to said first output signal.

10. The apparatus of claim 4, wherein said first amplifier comprises a differential amplifier.

11. The apparatus of claim 4, wherein said first amplifier comprises an amplifier with a switchable input port.

12. The apparatus of claim 11, wherein said switchable input port comprises a switch.

13. The apparatus of claim 4, wherein said second amplifier comprises a differential amplifier.

14. The apparatus of claim 4, wherein said second amplifier comprises an amplifier with a switchable input port.

15. The apparatus of claim 14, wherein said switchable input port comprises a switch.

16. The apparatus of claim 4, wherein said controller comprises:

first and second multiple-state devices, coupled to said first and second amplifiers, respectively, each for receiving a control signal and in accordance therewith operating in one of a plurality of states, wherein said first and second pluralities of modes of operations of said first and second amplifiers, respectively, are established in accordance with said pluralities of states of said first and second multiple-state devices; and a control circuit, coupled to said first and second multiple-state devices, for receiving said first and second reference voltages and in accordance therewith providing said control signal.

17. The apparatus of claim 16, wherein each one of said first and second multiple-state devices comprises a switch.

18. The apparatus of claim 16, wherein said control circuit comprises a voltage comparator.

19. The apparatus of claim 4, wherein during said first time period said first and second reference voltages comprise time-varying and fixed voltages, respectively.

20. The apparatus of claim 6, wherein said reference generator comprises a capacitor for selectively charging or discharging said first reference voltage from said initial reference value toward said final reference value.

21. The apparatus of claim 6, wherein said controller comprises a voltage comparator.

22. The apparatus of claim 6, wherein said controller comprises a voltage comparator and a switch.

23. The apparatus of claim 6, wherein said first amplifier comprises a differential amplifier.

24. The apparatus of claim 6, wherein said first amplifier comprises a multiple-state element for receiving said control signal and in accordance therewith operating in either a first state or a second state during which said first output signal is substantially equal to said first reference voltage or substantially equal to a sum of said first reference voltage and a multiple of said first input signal, respectively.

25. The apparatus of claim 24, wherein said multiple-state element comprises a switch.

26. The apparatus of claim 6, wherein said second amplifier comprises a differential amplifier.

27. The method of claim 8, wherein said steps of establishing first and second pluralities of modes of operation in accordance with said first and second reference voltages together comprise the steps of:

providing a control signal in accordance with said first and second reference voltages; and establishing said first and second pluralities of modes of operation in accordance with said control signal.

28. The method of claim 27, wherein said step of providing a control signal in accordance with said first and second reference voltages comprises comparing said first and second reference voltages.

29. The method of claim 27, wherein said step of establishing said first and second pluralities of modes of operation in accordance with said control signal comprises activating and deactivating a switch.

30. The method of claim 8, wherein said step of receiving a first reference voltage comprises receiving a time-varying voltage and said step of receiving a second reference voltage comprises receiving a fixed voltage.

31. The method of claim 9, wherein said step of providing a first reference voltage having a value between said power supply voltage and said circuit ground comprises selectively charging or discharging a capacitor from said initial reference value toward said final reference value.

32. The method of claim 9, wherein said step of providing a control signal in accordance with said first and second reference voltages comprises comparing said first and second reference voltages.

33. The method of claim 9, wherein said step of providing a control signal in accordance with said first and second reference voltages comprises comparing said first and second reference voltages and in accordance therewith providing said control signal.

34. The method of claim 9, wherein said step of operating in one of a first plurality of modes of operation in accordance with said control signal for providing a first output signal comprises operating a multiple-state element in either a first state or a second state in accordance with said control signal during which said first output signal is substantially equal to said first reference voltage or substantially equal to a sum of said first reference voltage and a multiple of said first input signal, respectively.

35. The method of claim 34, wherein said step of operating a multiple-state element comprises operating a switch to switch said first input signal.

36. The method of claim 9, wherein said step of operating in one of a second plurality of modes of operation in accordance with said control signal for providing a second output signal comprises operating a multiple-state element in either a first state or a second state in accordance with said control signal during which said second output signal is substantially equal to said first reference voltage or said second output signal is substantially equal in magnitude and inverse in phase to said first output signal, respectively.

37. The method of claim 36, wherein said step of operating a multiple-state element comprises operating a switch to switch said first output signal.

* * * * *